United States Patent
Duan

(10) Patent No.: US 10,247,771 B2
(45) Date of Patent: Apr. 2, 2019

(54) TESTING DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Xing Duan, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 304 days.

(21) Appl. No.: 15/075,802

(22) Filed: Mar. 21, 2016

(65) Prior Publication Data

US 2017/0248496 A1 Aug. 31, 2017

(30) Foreign Application Priority Data

Feb. 29, 2016 (CN) .......................... 2016 1 0110700

(51) Int. Cl.
*G01R 1/067* (2006.01)
*G01R 31/28* (2006.01)

(52) U.S. Cl.
CPC ..... *G01R 31/2808* (2013.01); *G01R 31/2806* (2013.01); *G01R 31/2865* (2013.01); *G01R 31/2867* (2013.01); *G01R 31/2893* (2013.01); *G01R 1/06711* (2013.01)

(58) Field of Classification Search
CPC ............ G01R 31/2806; G01R 31/2808; G01R 31/2865; G01R 31/2867; G01R 31/2893
See application file for complete search history.

(56) References Cited

U.S. PATENT DOCUMENTS

| | | | | |
|---|---|---|---|---|
| 6,084,422 A | * | 7/2000 | Bartholomew .... | G01R 31/2808 324/754.13 |
| 2009/0214326 A1 | * | 8/2009 | Tsai ................... | G01R 31/2893 414/788.9 |

* cited by examiner

*Primary Examiner* — Paul M. West
(74) *Attorney, Agent, or Firm* — ScienBiziP, P.C.

(57) ABSTRACT

A testing device for testing an electronic device includes a base, a testing mechanism, a pushing mechanism, and a fastening mechanism. The testing mechanism is rotatably fastened to the base and can be rotated from a first position to a second position. The fastening mechanism is mounted on the base. The pushing mechanism is rotatably mounted on the testing mechanism. When the testing mechanism is rotated from the first position to the second position, the pushing mechanism is rotated and pushes against the testing mechanism. The testing mechanism is connected to an electronic device. The testing mechanism is positioned in the second position via the fastening mechanism.

16 Claims, 6 Drawing Sheets

TESTING DEVICE

CROSS-REFERENCE TO RELATED APPLICATIONS

This application claims priority to Chinese Patent Application 201610110700.5 filed on Feb. 29, 2016, the contents of which are incorporated by reference herein.

FIELD

The subject matter herein generally relates to a testing device.

BACKGROUND

Electronic devices need to be tested after manufacture. When an electronic device is tested, the electronic device needs to abut the testing device.

BRIEF DESCRIPTION OF THE DRAWINGS

Implementations of the present technology will now be described, by way of example only, with reference to the attached figures.

DETAILED DESCRIPTION

Figure 1:
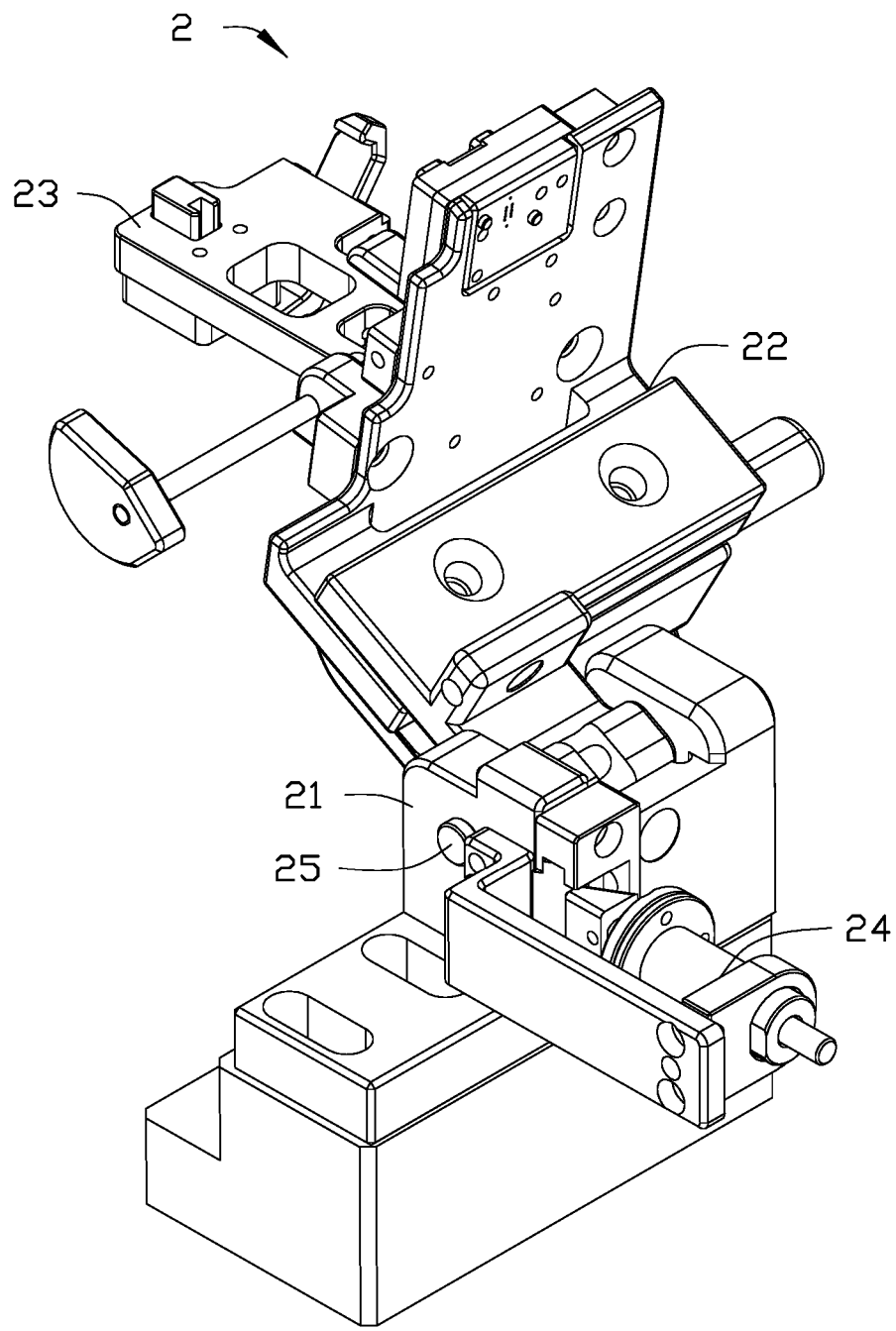
FIG. 1 is an isometric view of one embodiment of a testing device.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series, and the like.

Figure 2:
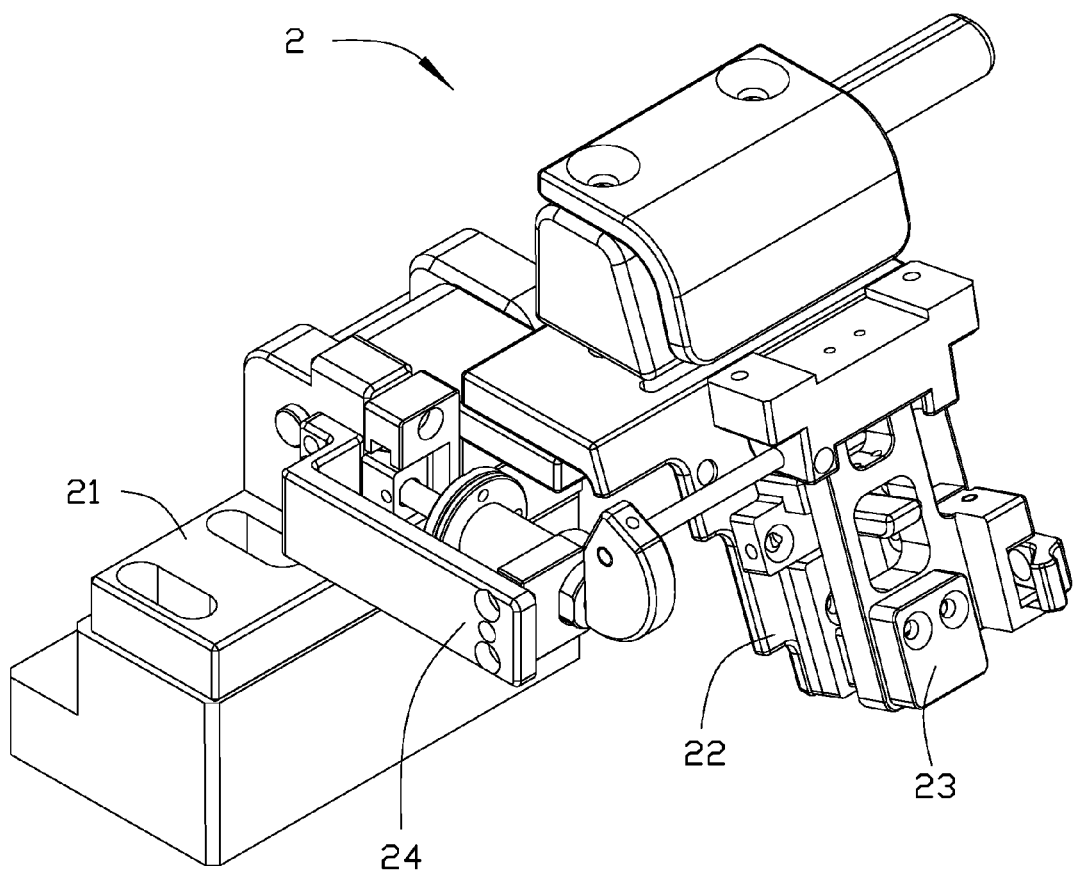
FIG. 2 is similar to FIG. 1 showing the testing device of FIG. 1 in a working state.

FIG. 1 shows a testing device 2 of an embodiment of the present invention before it is in an operating state. FIG. 2 shows the testing device 2 under the operating state. The testing device 2 includes a base 21, a testing mechanism 22, a pushing mechanism 23, and a fastening mechanism 24. The testing mechanism 22 is rotatably fastened to the base 21 and can be rotated from a first position to a second position. When the testing mechanism 22 is in the second position, it is capable of being connected to a tested member (not shown) for testing. The fastening mechanism 24 is mounted on the base 21. The pushing mechanism 23 is rotatably mounted on the testing mechanism 22. When the testing mechanism 22 is rotated from the first position to the second position, the pushing mechanism 23 is rotated to push the testing mechanism 22, thereby causing the testing mechanism 22 to be tightly coupled to the tested member. The pressing mechanism 23 triggers the locking mechanism 24 while pushing the testing mechanism 22, such that the locking mechanism 24 locks the testing mechanism 22 in the second position.

Figure 3:
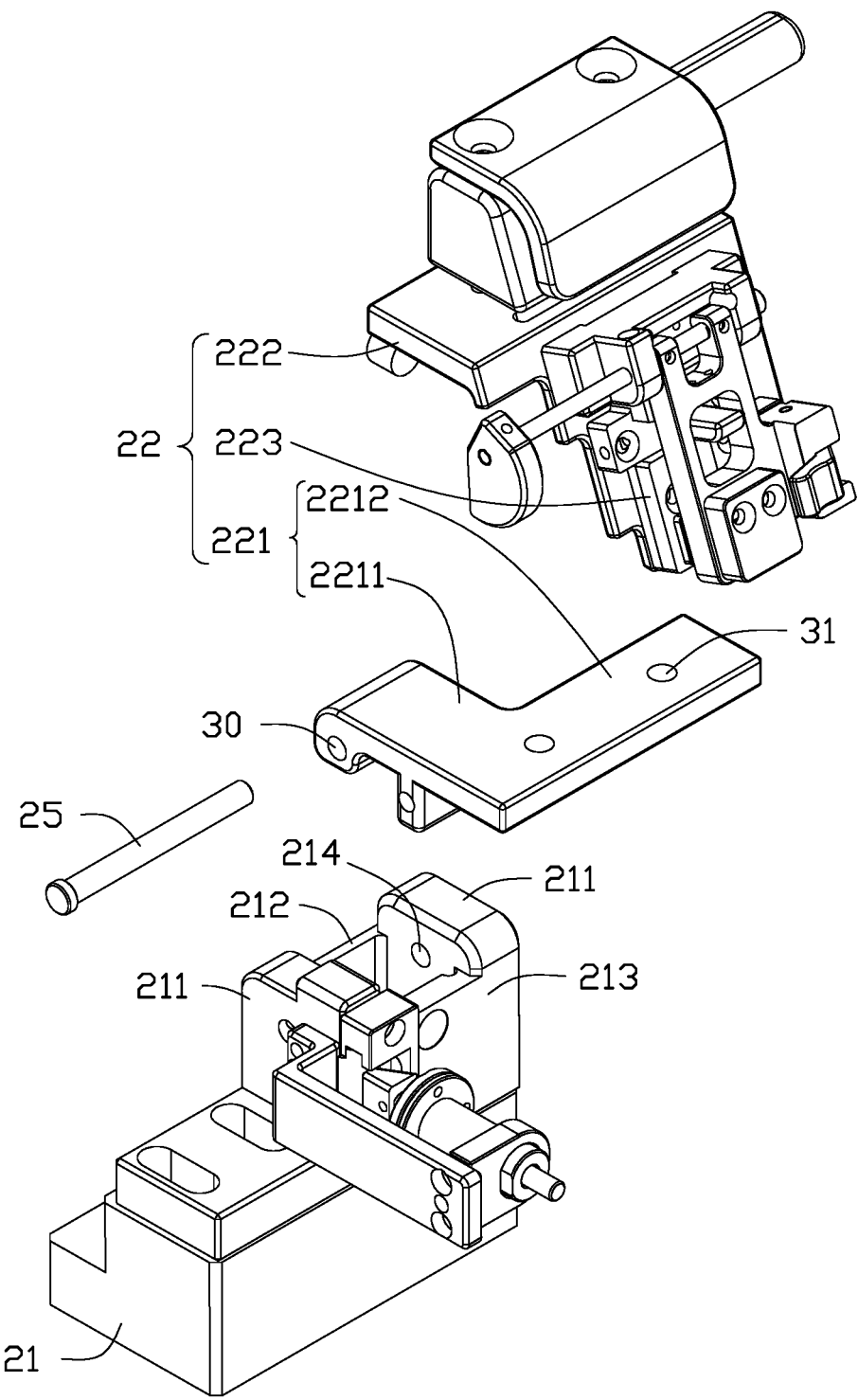
FIG. 3 is an exploded, isometric view of a base and a testing mechanism of the testing device of FIG. 2.

FIG. 3 illustrates the base 21 and the testing mechanism 22 of the testing device 2. The testing mechanism 22 is rotatably fastened to the base 21 via a first shaft 25. The base 21 includes two first plates 211, a second plate 212, and a third plate 213. The second plate 212 is connected to the two first plates 211 and can be substantially parallel to the third plate 213. Each first plate 211 defines a first through hole 214.

The testing mechanism 22 includes a first connecting plate 221, a second connecting plate 222 connected to the first connecting plate 221, and a testing member 223 mounted on the second connecting plate 222. The first connecting plate 221 includes a first connecting portion 2211 and a second connecting portion 2212. The first connecting portion 2211 is rotatably connected to the base 21. The second connecting portion 2212 is connected to the second connecting plate 222 via a fixing hole 31 of the second connecting portion 2212. In at least one embodiment, the first connecting plate 221 can be substantially L-shaped. The first connecting portion 2211 defines a shaft hole 30. The first shaft 25 extends into the first through hole 214 and into the shaft hole 30 to fix the first connecting plate 221 to the base 21. The testing member 223 includes a plurality of pogo pins (not shown) for inserting the tested member to test the tested member. In an embodiment, when the testing member 223 is pushed, the pogo pins is driven by the testing member 223 to protrude from a surface of the testing member 223 to be connected to the tested member. In an embodiment, the tested member may be a cable of a mobile phone circuit board or a Pogo pin connector.

Figure 4:
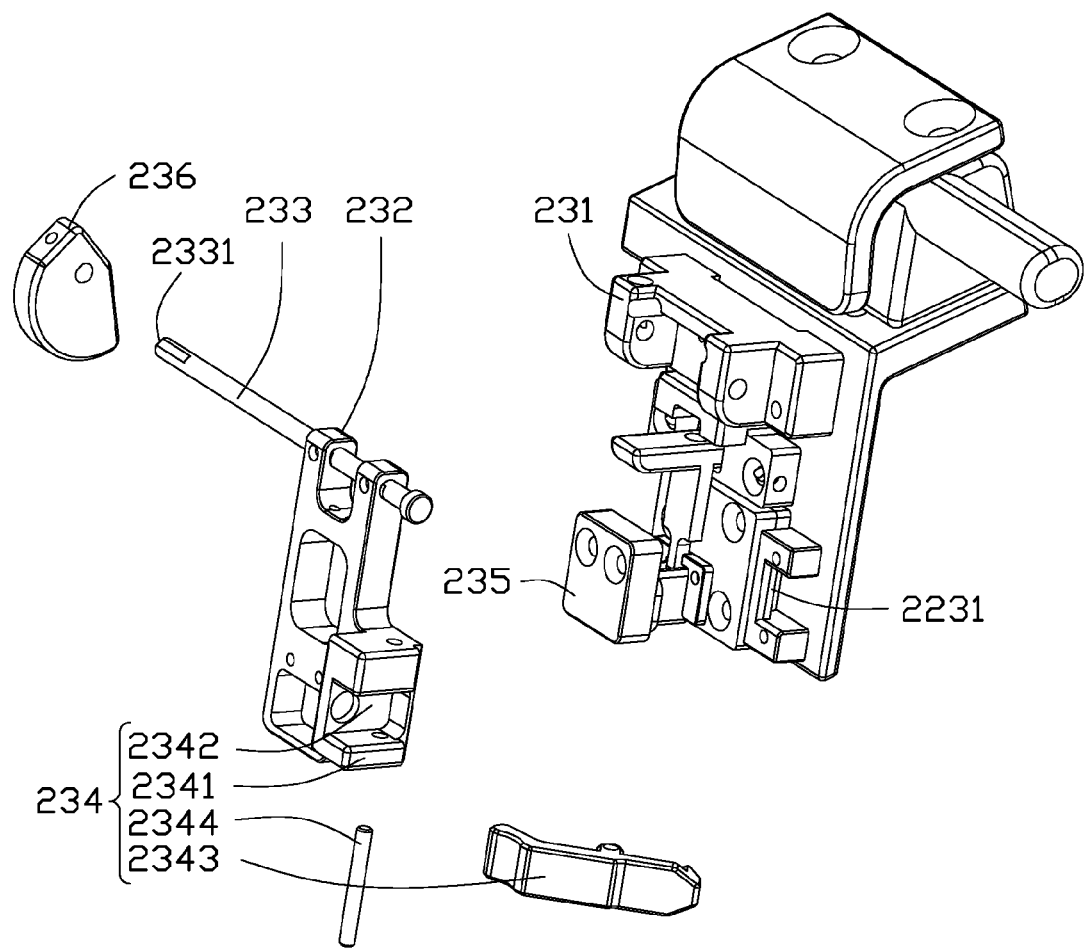
FIG. 4 is an exploded, isometric view of a pushing mechanism and the testing mechanism of the testing device of FIG. 2.

FIG. 4 illustrates the pushing mechanism 23 of the testing device 2. The pushing mechanism 23 includes a mounting member 231, a pushing plate 232, a second shaft 233, a locking member 234, a block 235, and a pushing member 236. The mounting member 231 is fixed to the second connecting plate 222. The pushing member 236 is mounted on an end 2331 of the second shaft 233. In at least one embodiment, the pushing member 236 can be a cam. The pushing plate 232 is rotatably mounted on the mounting member 231 via the second shaft 233. The block 235 and the locking member 234 are mounted on the pushing plate 232.

The locking member 234 includes two first protrusions 2341, a connecting block connected to the two first protrusions 2341, a hook 2343, and a third shaft 2344. The hook 2343 is rotatably mounted on the pushing plate 232 via the third shaft 2344. The testing member 223 defines a groove 2231. When the pushing plate 232 pushes against the testing member 223, the hook 2343 is engaged with the groove 2231 to fix the pushing plate 232 on the testing member 223.

Figure 5:
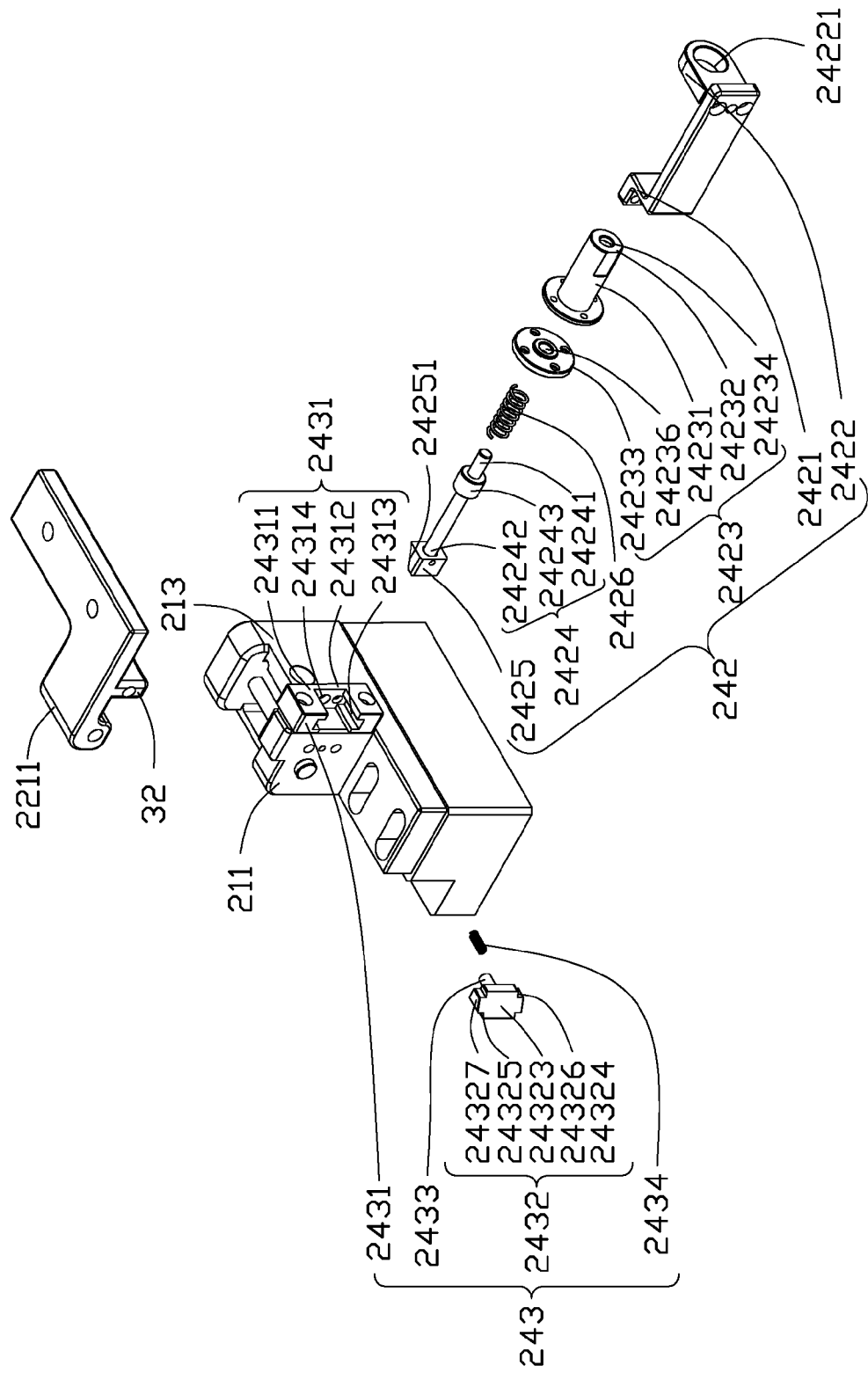
FIG. 5 is an exploded, isometric view of a fastening mechanism of the testing device of FIG. 2.
Figure 6:
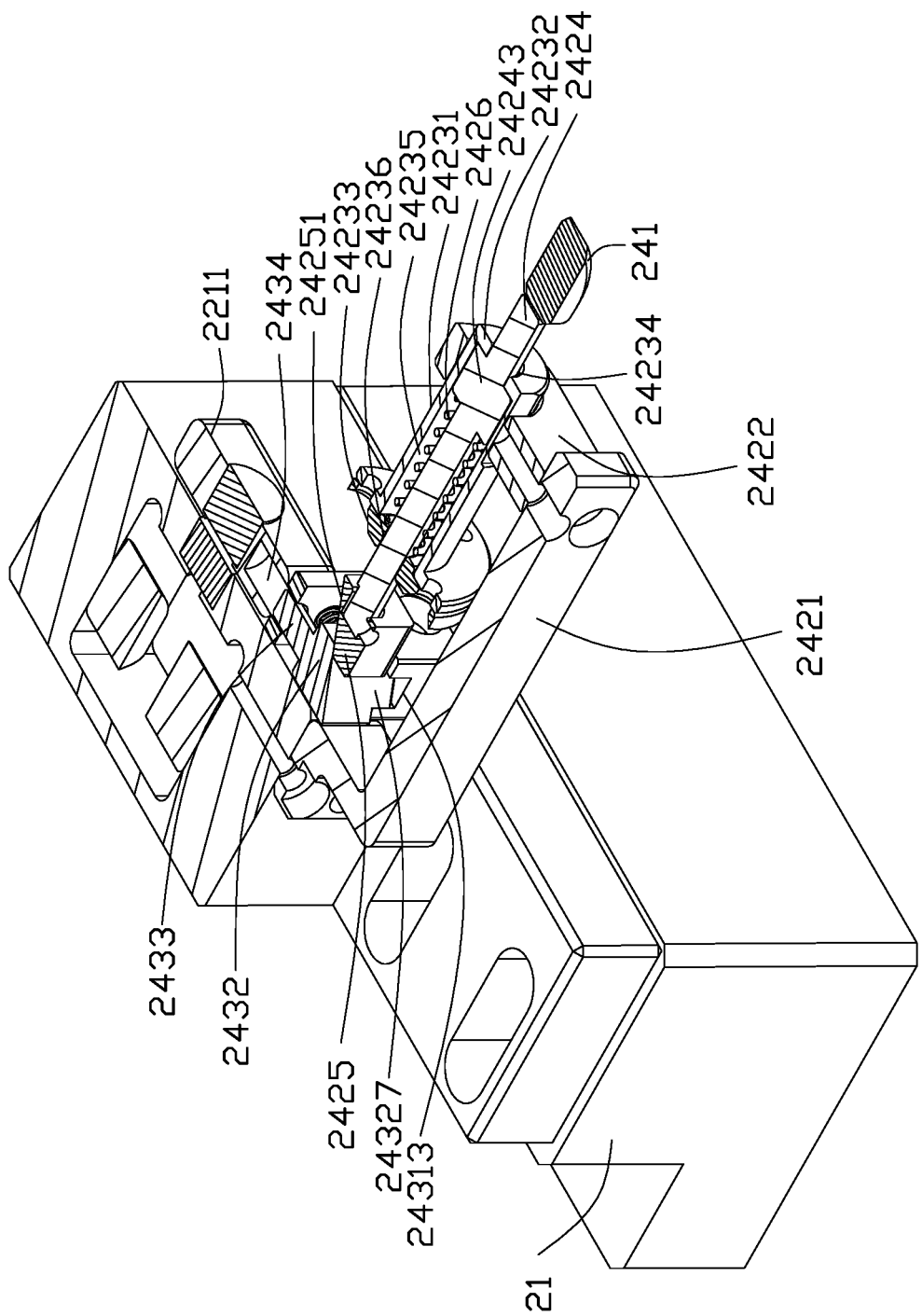
FIG. 6 is a cross-sectional view of line X-X in FIG. 5 through the fastening mechanism.

FIG. 5-6 illustrate the fastening mechanism 24 of the testing device 2. The fastening mechanism 24 includes a driving portion 242 and a fixing portion 243. The driving portion 242 is mounted on the first plate 211 of the base 21. The fixing portion 243 is mounted on the third plate 213 of the base 21.

The driving portion 242 includes a sleeve 2423. The sleeve 2423 includes a body 24231, a first baffle 24232 connected to the body 24231, and a second baffle 24233 connected to the body 24231. The first baffle 24232 defines a first mounting hole 24234. The body 24231 defines a second mounting hole 24235. The second baffle 24233 defines a third mounting hole 24236.

The driving portion 242 further includes a fixing plate 2421, a mounting plate 2422, a rod 2424, a first bump 2425, and a spring 2426. The fixing plate 2421 is fixed on the first plate 211 of the base 21. The mounting plate 2422 defines a second through hole 24221. The body 24231 extends into the second through hole 24221 and is fixed to the mounting plate 2422. The rod 2424 includes a first end 24241 and a second end 24242. The rod 2424 is sheathed in the sleeve 2423. The first end 24241 extends out of the first mounting hole 24234. The second end 24242 extends out of the third mounting hole 24236. The second end 24242 is connected on the first bump 2425. The first bump 2425 includes a slanted surface 24251. The rod 2424 includes a stopper portion 24243. The spring 2426 is sleeved on the rod 2424 and is located between the stopper portion 24243 and the second baffle 24233.

A guiding groove 2431 is defined in the third plate 213. The fixing portion 243 includes a second bump 2432 mounted in the guiding groove 2431 and a lock pin 2433. The guiding groove 2431 includes two first walls 24311 substantially parallel to each other and a second wall 24312 connected to the two first walls 24311. Each first wall 24311 defines a sliding groove 24313. The second wall 24312 defines a third through hole 24314. The second bump 2432 includes a first side 24323, a second side 24324 opposite to the first side 24323, a third side 24325, and a fourth side 24326. The third side 24325 and the fourth side 24326 each include a sliding block 24327. Each sliding block 24327 is mounted in the sliding groove 24313. The connecting portion 2211 defines a pin hole 32. The pin hole 32 can be engaged with the lock pin 2433 to fix the first connecting plate 221.

When the testing device 2 is working, the testing member 223 is rotated from the first position to the second position around the first shaft 25. The pushing plate 232 is rotated around the second shaft 233 to drive the block 235 to press against the testing member 223. The hook 2343 is engaged with the groove 2231 to fix the pushing plate 232 on the testing member 223. A sprung needle (not shown) extends out of the testing member 223. The pushing member 236 drives the rod 2424 to move along the sleeve 2423. The first bump 2425 pushes the second bump 2432 to move along the sliding groove 24313. The lock pin 2433 extends into the third through hole 24314 and the pin hole 32. The testing mechanism 22 is fixed in the second position. The member being tested is connected to the sprung needle to test the tested member. When the member is being tested, the pushing plate 232 is rotated around the second shaft 233 and moved away from the testing member 223.

The embodiments shown and described above are only examples. Many details are often found in the art such as the other features of a testing device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A testing device comprising:
   a base;
   a testing mechanism rotatably fastened to the base and configured to be rotated from a first position to a second position;
   a pushing mechanism rotatably fastened to the testing mechanism; and
   a fastening mechanism mounted on the base;
   wherein when the testing mechanism is in the first position, the pushing mechanism is away from the fastening mechanism; when the testing mechanism is in the second position, the testing mechanism is configured to connect to a tested member; when the testing mechanism is rotated from the first position to the second position, the pushing mechanism is rotated to push the testing mechanism, and the testing mechanism is fixed in the second position via the fastening mechanism; and
   wherein the testing member is pushed by the pushing mechanism along a direction perpendicular to an axis of rotation of the pushing mechanism.

2. The testing device of claim 1, wherein the pushing mechanism comprises a pushing member, the fastening mechanism comprises a driving portion, the driving portion comprises a rod, and when the testing mechanism is rotated from the first position to the second position, the pushing member drives the rod to move to fix the testing mechanism.

3. The testing device of claim 2, wherein the pushing member is a cam.

4. The testing device of claim 2, wherein the driving portion further comprises a sleeve, a fixing plate, a mounting plate, and a first bump, the mounting plate defines a second through hole, the sleeve comprises a body, the body extends into the second through hole and is fixed to the mounting plate, and the rod is sheathed with sleeve and is connected on the first bump.

5. The testing device of claim 4, wherein the driving portion further comprises a spring, the sleeve further comprises a second baffle, the rod comprises a stopper portion, and the spring is sheathed with the rod and is located between the stopper portion and the second baffle.

6. The testing device of claim 4, wherein the fastening mechanism comprises a second bump and a lock pin, the fastening mechanism defines a guiding groove, the second bump is mounted in the guiding groove, and the first bump pushes the second bump to move along the sliding groove.

7. The testing device of claim 1, wherein the testing mechanism comprises a first connecting plate, a first shaft is engaged with the first connecting plate, and the first connecting plate is rotatably fastened to the base.

8. The testing device of claim 7, wherein the testing mechanism further comprises a second connecting plate and a testing member, the testing member is fixed to the second connecting plate, and the second connecting plate is connected to the first connecting plate.

9. A testing device to test a tested member, comprising:
a fastening mechanism;
a testing mechanism be configured to rotate relative to the fastening mechanism; and
a pushing mechanism rotatably fastened to the testing mechanism; and
wherein the pushing mechanism is rotated to push the testing mechanism, and the testing mechanism is fixed in a position via the fastening mechanism; and
wherein the testing member is pushed by the pushing mechanism along a direction perpendicular to an axis of rotation of the pushing mechanism.

10. The testing device of claim 9, wherein the pushing mechanism comprises a pushing member, the fastening mechanism comprises a driving portion, the driving portion comprises a rod, and when the testing mechanism is rotated from the first position to the second position, the pushing member drives the rod to move to fix the testing mechanism.

11. The testing device of claim 10, wherein the pushing member is a cam.

12. The testing device of claim 11, wherein the driving portion further comprises a sleeve, a fixing plate, a mounting plate, and a first bump, the mounting plate defines a second through hole, the sleeve comprises a body, the body extends into the second through hole and is fixed to the mounting plate, and the rod is sheathed with sleeve and is connected on the first bump.

13. The testing device of claim 12, wherein the driving portion further comprises a spring, the sleeve further comprises a second baffle, the rod comprises a stopper portion, and the spring is sheathed with the rod and is located between the stopper portion and the second baffle.

14. The testing device of claim 12, wherein the fastening mechanism comprises a second bump and a lock pin, the fastening mechanism defines a guiding groove, the second bump is mounted in the guiding groove, and the first bump pushes the second bump to move along the sliding groove.

15. The testing device of claim 9, wherein the testing mechanism further comprises a first connecting plate, a first shaft is engaged with the first connecting plate, and a base, and the first connecting plate is rotatably fastened to the base.

16. The testing device of claim 15, wherein the testing mechanism further comprises a second connecting plate and a testing member, the testing member is fixed to the second connecting plate, and the second connecting plate is connected to the first connecting plate.

* * * * *